United States Patent [19]

Sohda et al.

[11] Patent Number: 5,396,077
[45] Date of Patent: Mar. 7, 1995

[54] ELECTRON BEAM LITHOGRAPHY APPARATUS HAVING ELECTRON OPTICS CORRECTION SYSTEM

[75] Inventors: Yasunari Sohda, Hachioji; Hiroyuki Itoh, Katsuta; Yasuhiro Someda, Kokubunji; Yoshinori Nakayama, Sayama; Hidetoshi Satoh, Hachioji; Genya Matsuoka, Ome, all of Japan

[73] Assignee: Hitachi, Ltd., Tokyo, Japan

[21] Appl. No.: 213,737

[22] Filed: Mar. 16, 1994

[30] Foreign Application Priority Data

Mar. 18, 1993 [JP] Japan .................................. 5-058524

[51] Int. Cl.$^6$ ......................................... H01J 37/304
[52] U.S. Cl. ............................. 250/492.2; 250/492.22
[58] Field of Search ............ 250/492.1, 492.2, 492.22, 250/492.3

[56] References Cited

U.S. PATENT DOCUMENTS

| | | | |
|---|---|---|---|
| 4,578,587 | 3/1986 | Behringer et al. | 250/492.2 |
| 4,647,782 | 3/1987 | Wada et al. | 250/492.22 |
| 4,996,434 | 2/1991 | Tanaka | 250/492.22 |
| 5,171,965 | 12/1992 | Suzuki et al. | 250/492.2 |

Primary Examiner—Jack I. Berman
Assistant Examiner—James Beyer
Attorney, Agent, or Firm—Fay, Sharpe, Beall, Fagan, Minnich & McKee

[57] ABSTRACT

An electron beam apparatus used in a cell projection method has a system for correcting the electron optics. A figured electron beam that has been passed through a cell having a complex figure shape is directed onto a stage on which a substrate is positioned. A fine hole is formed in the substrate and an electron detector is positioned underneath the fine hole to receive the electrons that pass through the fine hole. The output signal of the electron detector is processed to provide a representation of the degree of focus and astigmatism correction of the electron optics. When a line and space pattern is used to shape the electron beam, the output signal from the electron detector has a series of peak intensity values that, when maximized, indicate an optimum correction of the electron optics. Optionally, a limited aperture is positioned between the substrate having a fine hole and the electron detector to limit the detection of scattered electrons that have not passed through the fine hole.

5 Claims, 8 Drawing Sheets

ELECTRON BEAM LITHOGRAPHY APPARATUS HAVING ELECTRON OPTICS CORRECTION SYSTEM

FIELD OF THE INVENTION

The present invention relates to an electron optics correction system for an electron beam lithography apparatus used in semiconductor manufacturing processes and in particular to an electron beam lithography apparatus that uses a cell projection method.

Conventionally, correction of the electron optics for an electron beam lithography apparatus, such as focus correction or astigmatism correction, is performed by using a rectangular beam or a point beam of electrons. For example, a wire cross is scanned with a rectangular or point beam of electrons in the X and Y directions, and the transmitting electrons or the reflective electrons are detected with an electron detector. The detected signals are then differentiated linearly with respect to the scanning distance to determine the profiles of the electron beams in the X and Y directions, and the correction of the electron optics is made with reference to the profiles.

SUMMARY OF THE INVENTION

Figure 9:
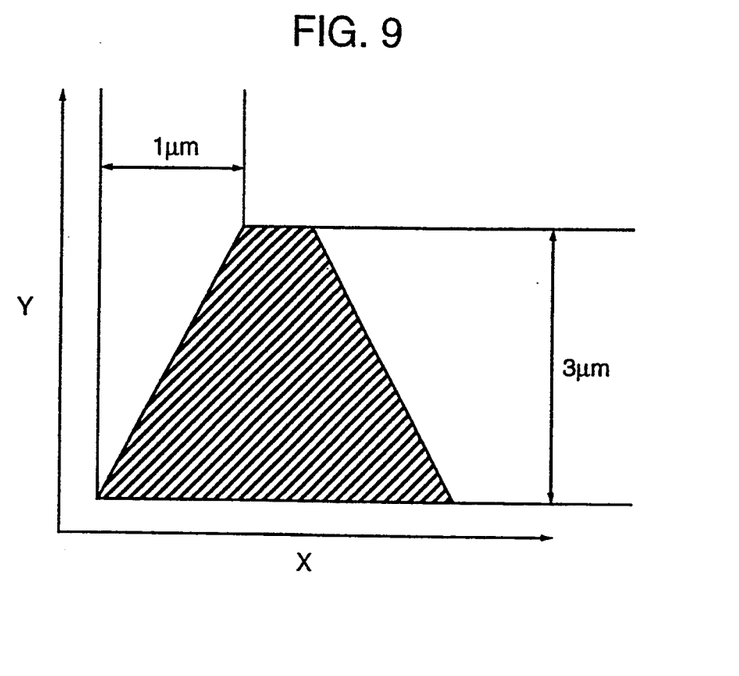
FIG. 9 is a diagram illustrating the profile of a conventional rectangular electron beam.

Conventional electron optics correction techniques cannot be applied to a lithography apparatus performing lithography using a cell projection method. In a cell projection method, the figures in the cell have a complex shape and the conventional rectangular or point beam of electrons cannot be adequately sized and shaped to permit scanning of the cell figures for the purpose of obtaining high resolution detection signals that can be used for correcting the electron optics. Rather, a conventional rectangular electron beam takes a trapezoidal shape, as shown in FIG. 9, wherein the vertically extending sides of the beam taper inwardly by as much as 1 $\mu$m, thus making it difficult to measure the edge sharpness of a shape having a minimum feature size of 0.1 $\mu$m. That is, the shape of the electron beam cannot be controlled to provide sufficient edge sharpness for scanning a complex figure like that found in the cell used in a cell projection method. Therefore, the conventional methods for correcting electron optics are unsuitable for an electron beam lithography apparatus using a cell projection method.

It is an object of the invention to overcome the problems associated with correcting the electron optics for an electron beam lithography apparatus using a cell projection method that have been encountered in the prior art.

It is an object of the invention to provide an electron beam optics correction system and method for use with an electron beam lithography apparatus that uses a cell projection method.

It is a further object of the invention to provide an electron beam lithography apparatus having electron optics that can be corrected according to the objects of the present invention.

To achieve the above objects, according to the present invention, the electron optics of an electron beam lithography apparatus are corrected by directly using the figured electron beam of a cell projection without modification. For this purpose, the figured electron beam is passed through a substrate having a fine hole, and the electrons that pass through the fine hole are detected by an electron detector. The output of the detector is analyzed can used to control the electron optics for shaping the electron beam. Specifically, the electron optics of the lithography apparatus can be adjusted so that the edge sharpness and contrast of the image obtained from detecting the figured electron beam is maximized.

Preferably, the fine hole has a size ranging from smaller than to twice as large as the minimum feature size of a lithographic figure of a cell. The substrate having the fine hole is positioned in proximity to the sample surface undergoing the lithography and preferably has a thickness that is sufficiently smaller than the electron range, for example less than 10 $\mu$m. It is preferred to make the fine hole using a thin substrate. For example, to make a 0.1 $\mu$m radius round hole, an approximately 1 $\mu$m thick substrate is the technological limit of thickness, if it is assumed that an aspect ratio of 10 is the technological limit. The shape of the hole in the substrate is preferably square, but a hole having a round shape is acceptable. By using a detection signal generated from the electrons passing through the fine hole, a figured electron beam of a complex shape can be observed with sufficiently high resolution to enable accurate focus and astigmatism correction of the electron optics.

Optionally, a limited aperture can be provided between the substrate having the fine hole and the electron detector for shielding the electron detector from receiving electrons scattered by the substrate that do not pass through the hole. By providing such a limited aperture, the ratio of the number of electrons passing through the hole that are detected by the electron detector to the number of scattered electrons that are detected can be at least as high as 60:1.

Figure 2:
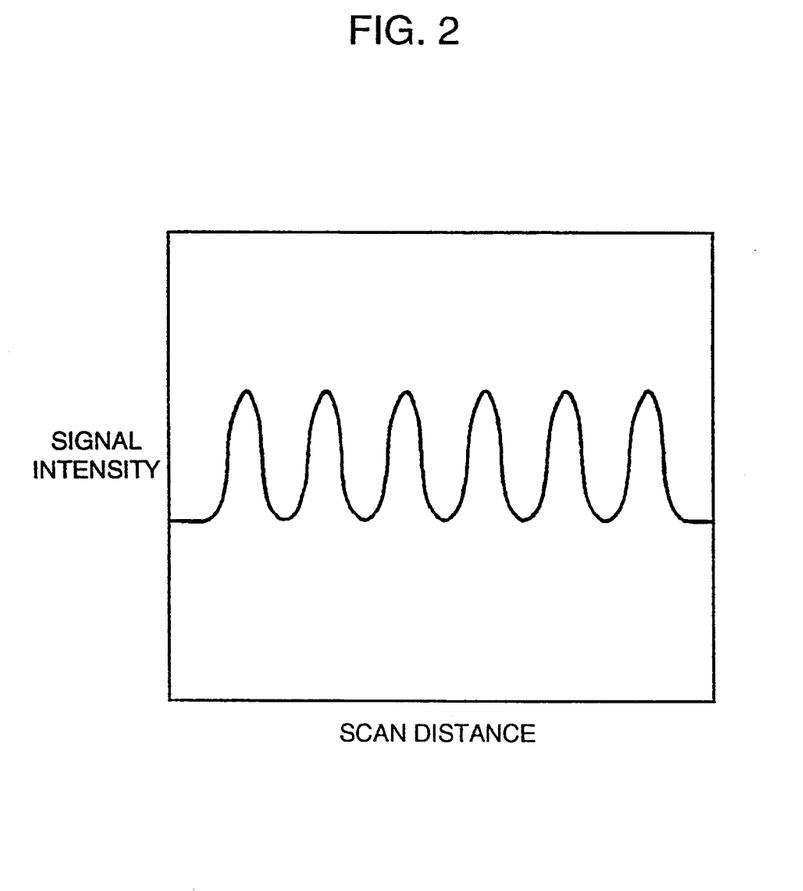
FIG. 2 is a diagram of the signal intensity of a signal output from the electron detector showing the intensity distribution for a signal obtained from a figures electron beam that is passed through a call having line and space pattern.
Figure 7:
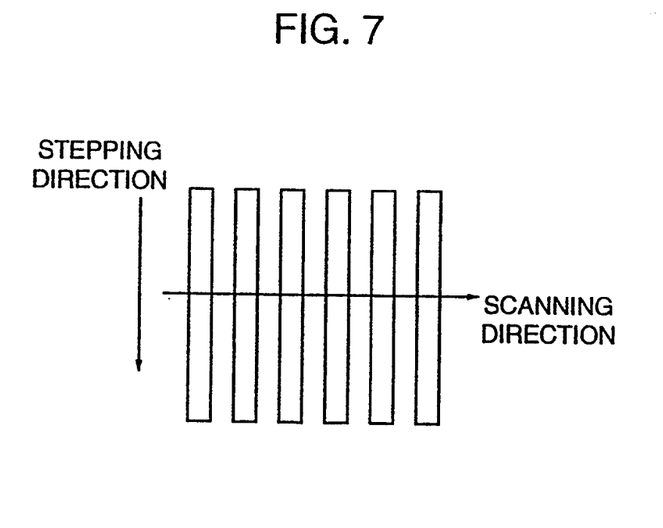
FIG. 7 is a diagram of a cell having a line and space pattern which is scanned by the figured electron beam during rough correction of the electron objects.
Figure 8:
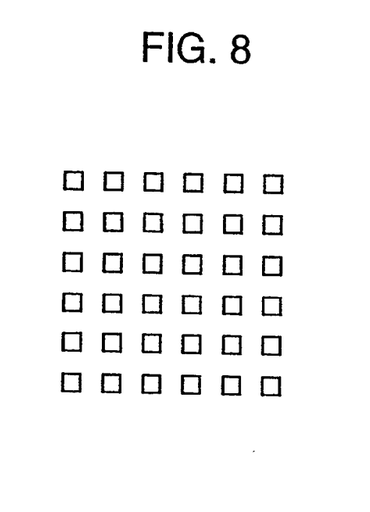
FIG. 8 is a diagram of a cell having a dot pattern arranged in X and Y directions for use in a two-dimensional electron optics correction technique.

To correct the electron optics it is preferable to use an electron beam of a shape that is relatively simple, as opposed to complex. As shown in FIG. 7, a simple line and space pattern is used to provide the figured electron beam. As the beam scans the line and space pattern, as shown in FIG. 2, signal intensity peaks are formed that correlate with the spaces of the figure through which the electron beam is passed. By observing the signal intensity output, the electron beam optics can be adjusted to maximize the intensity of the peaks. Further, if the electron beam is passed through a cell having a figure with dots, as shown in FIG. 8, that are regularly arranged in the X and Y scanning direction, it is possible to perform simultaneous two-dimensional correction of the electron objects.

According to the present invention, the signals received from the detector are not required to be differentiated, as in the prior art. Rather, the invention provides detection signals having a sufficiently high signal to noise ratio such that the electron optics can be corrected easily and accurately.

DETAILED DESCRIPTION OF THE PREFERRED EMBODIMENTS

According to the present invention, a figured electron beam from an electron beam lithography apparatus using a cell projection method is passed through a fine hole in a substrate that is positioned on a sample stage to be substantially flush with the sample that is to be subjected to lithography. The electrons passing through the fine hole are detected by an electron detector and the output of the electron detector is observed and used to correct the electron optics of the lithography apparatus.

The substrate in which the fine hole is formed has a thickness that is considerably smaller than the electron range of an electron beam provided by a conventional electron beam lithography apparatus. Therefore, the electrons that do not pass directly through the fine hole penetrate the substrate and become scattered electrons. When the substrate has a thickness that is more than ten times as great as the mean free path of the electrons, however, the electrons are mostly scattered at great angles in the substrate and therefore are not received by the electron detector. Accordingly, the thickness of the substrate is preferably 1 to 3 $\mu$m. On the other hand, the hole through which the electron beam passes is preferably in the range of less than twice the minimum feature size of the figure used in the cell projection method of the electron beam.

Figure 3:
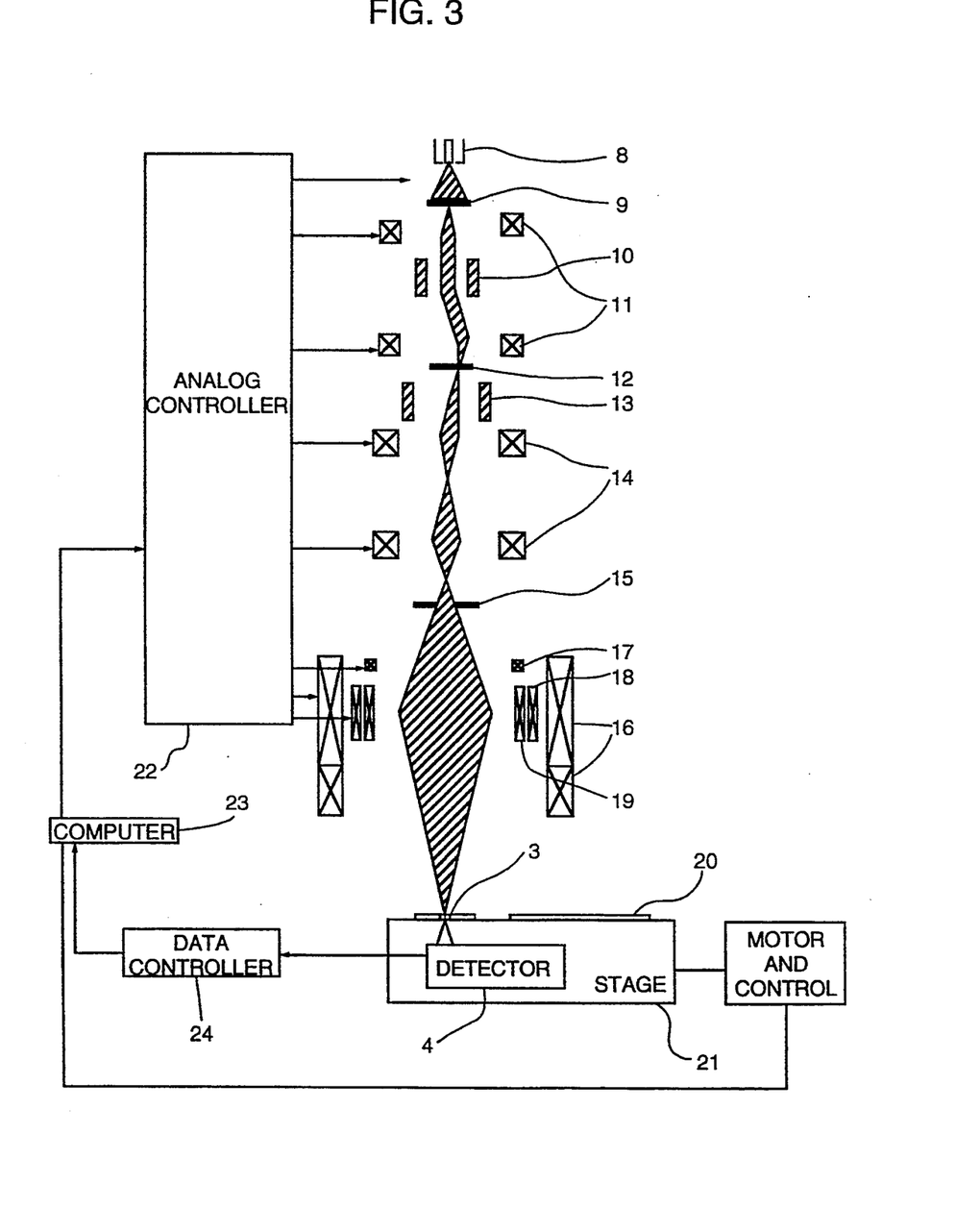
FIG. 3 is a schematic diagram of an electron beam lithography apparatus using a cell projection method and having electron optics that are corrected using the correction technique of the present invention.

A specific embodiment of an electron beam apparatus that uses a cell projection method and to which the present invention is directed is shown schematically in FIG. 3. An electron beam from an electron gun 8 is passed through a first aperture 9 to limit its size and is then projected onto a second aperture 12 through projection lenses 11. The second aperture 12 has a number of figure apertures or cells that are used in the cell projection method. The electron beam is deflected by a cell deflection deflector 10 to select one of these cells, according to this method. Once the electron beam passes through the selected cell of second aperture 12, it is redeflected by a redeflector 13 and focused through reducing lenses 14, an objective aperture 15 and an objective lens 16 so that it becomes focused on the surface of a sample placed on sample stage 21. Additionally, focus correction lenses 17 and astigmatism correction lenses 19 are provided for insuring proper correction of the electron beam so that it becomes focused on the stage.

According to the invention, the electron optics are corrected by passing a figured electron beam through a fine hole 3 formed in a substrate 2 that is placed on sample stage 21. A detector 4 receives the electrons that pass through the fine hole 3 and outputs a detection signal to data controller 24. A computer 23 receives the data from data controller 24 and processes the data to output correction data that is determined to be required for ensuring proper focus of the figured electron beam on the surface of the sample stage 21. An analog controller 22 receives the correction data as signals from computer 23 and makes the appropriate correction of lenses 11, 14 and 16–19.

Figure 1:
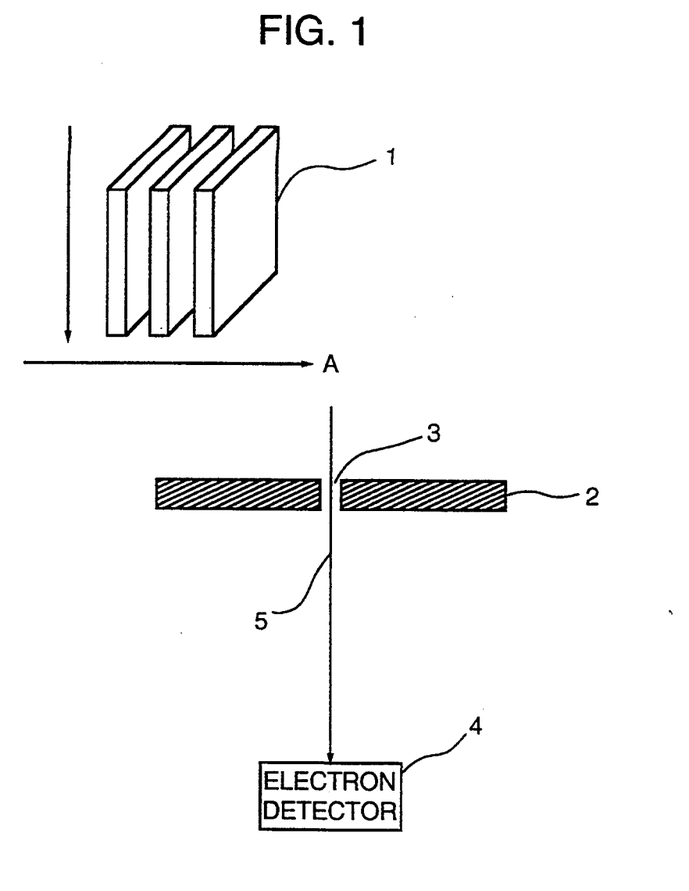
FIG. 1 is a diagram illustrating the detection of electrons of a figured electron beam that is passed through a fine hole in a substrate, according to a first embodiment of the present invention.

According to an example of the first embodiment of the invention explained with reference to FIG. 1, the fine hole 3 is formed in substrate 2 as a square hole having a dimension of 0.25 $\mu$m along each side. Substrate 2 is made of silicon and is positioned on the sample stage 21 so as to be nearly flush with the surface of sample 20, which is to be subjected to lithography.

The substrate 2 is scanned with the figured electron beam 1, which is shaped by passing it through a cell having a line and space pattern like that shown in FIG. 7. Preferably, the overall size of the cell is 5.0 $\mu$m square, with a line width of 0.3 $\mu$m. According to this embodiment, the electron beam is accelerated at 50 kV and the electrons that pass through the fine hole 3 are detected by an electron detector 4, such as a doped Si solid state detector (SSD).

In this embodiment, the thickness of the silicon substrate 2 (1 $\mu$m) is smaller than the range of the electron beam and, therefore, the electrons that pass through the silicon substrate 2 partly enter the electron detector 4. However, these electrons are scattered at large angles in the silicon substrate 2 and enter the electron detector 4 at a probability of 1/10 or less. Therefore, the detected electrons 5 that have passed through the fine hole 3 in the silicon substrate 2 are detected to provide an output having a contrast, edge sharpness and peak intensity level that represents the degree of focus and astigmatism correction of the figured electron beam 1 as it is scanned across the hole 3.

For this embodiment, the resolution of the electron detector signal generated from the figured electron beam 1 is determined by the size of the fine hole 3. Using the signal from detector 4, the figured electron beam 1 is reproduced with a resolution of about 0.25 $\mu$m. In this case, the figured electron beam has a shape of a line and space pattern with a line width of about 0.3 $\mu$m. As a result, a representation of the line and space pattern is obtained from the output of the electron detector 4, wherein the edge sharpness of the figured electron beam can be determined from the detector signal, making it possible to correct the electron objects, such as focus correction and astigmatism correction.

Figure 4A:
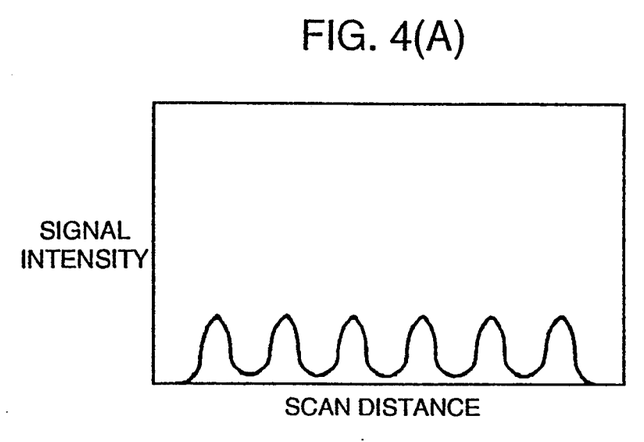
FIG. 4A–4C are diagrams of exemplary signals obtained from an electron detector receiving a figured electron beam that is passed through a substrate having a fine hole, in accordance with the invention.
Figure 4B:
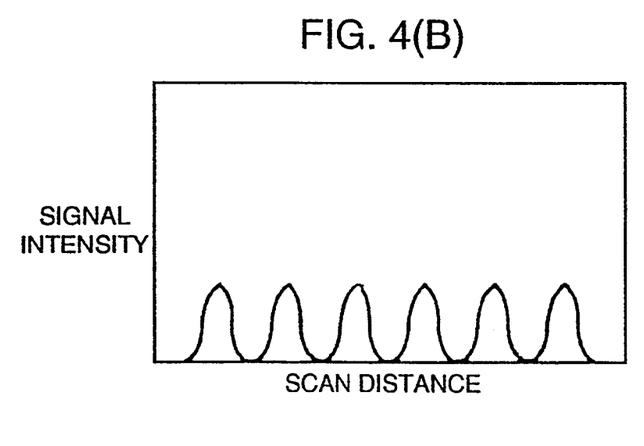
Figure 4C:
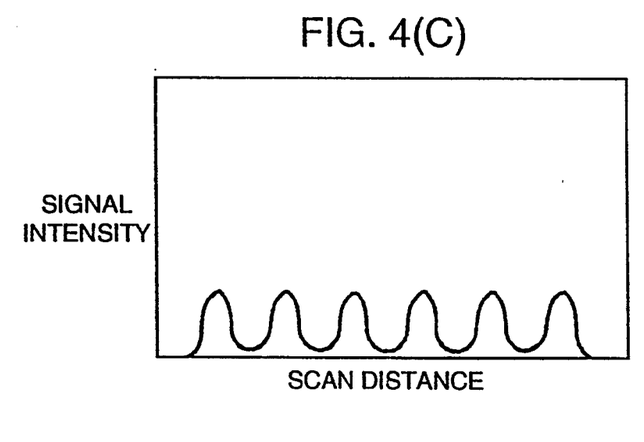

In FIGS. 4(A)–4(C), exemplary signals from the electron detector are shown that represent the detection of a figured electron beam that is passed through a line and space pattern of a cell. Incidentally, the signals that are shown are obtained once the background is subtracted from the signals. When the object is in focus, the peak intensity level of the signal increases and the separation of the pattern is improved.

In FIG. 4(A), one magnetic excitation level of the objective lens 16 is used for reference, and this level is changed, as shown in FIG. 4(B). When the magnetic excitation level of the objective lens 16 is changed still further, an output as shown in FIG. 4(C) is obtained. It can be seen by observing the signals of FIGS. 4(A)–4(C), that the peak intensity level is greatest for the signal shown in FIG. 4(B). This indicates that the objective lens is in focus when adjusted to the magnetic excitation level used to obtain the signal shown in FIG. 4(B).

In practice, deflection of the electron beam through the second aperture to select a cell causes the electron beam to be deflected from the axis of the electron optics. The amount of deviation varies depending upon the cell that is selected and the figures within the cell. Therefore, astigmatism develops in the electron beam. Further, the intensity of the electron beam varies depending upon the aperture rate of the cell that is selected, resulting in changed focal conditions. Prior to performing lithography using the apparatus, therefore, the correction amounts for focus and astigmatism correction are measured using the figured electron beam that is actually used in the lithography of a sample. These adjustment amounts are then stored for each cell or each figure in the computer 23, for example, so that these values can be retrieved during the lithography of a sample. In this way, fine adjustment of the electron optics during lithography of samples is insured even when the electron beam is figured according to many different cells during the lithography process. For example, in the example of shaping the electron beam by a line and space figure, a pattern having a spacing of 0.2 $\mu$m can be accurately drawn using the apparatus.

Figure 5:
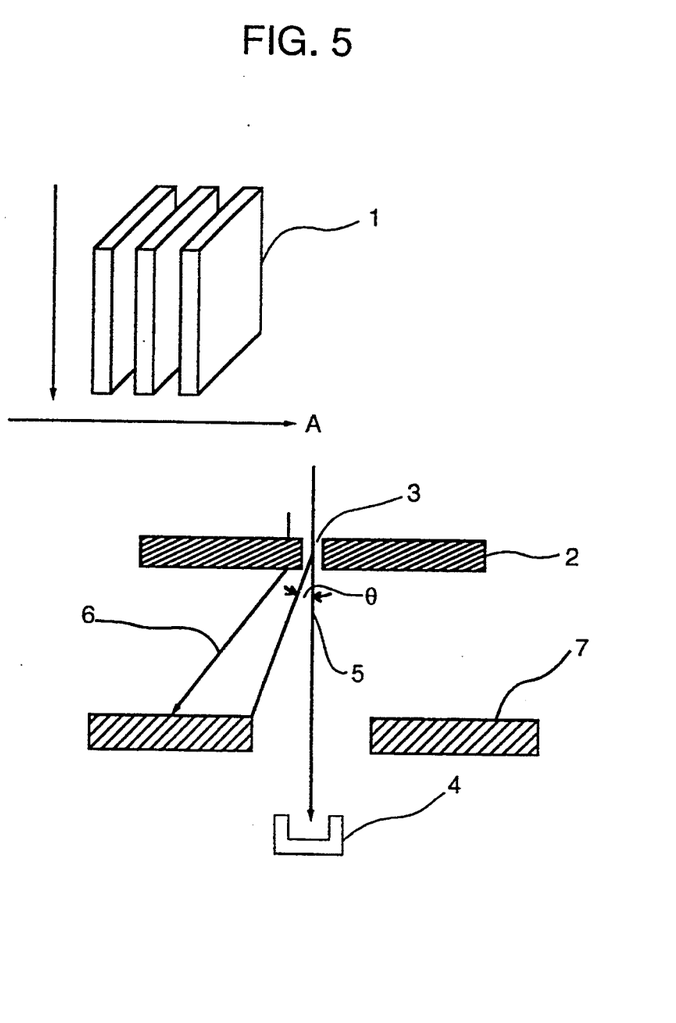
FIG. 5 is a diagram illustrating the detection of a figured electron beam that is passed through a fine hole in a substrate wherein a limited aperture shutter is positioned between the electron detector and the substrate, according to a second embodiment of the present invention.

In the second embodiment of the invention, shown in FIG. 5, a limited aperture 7 is interposed between the electron detector 4 and the substrate 2 having the fine hole 3. In a specific example according to this embodiment, the substrate 2 has a thickness of 1.0 $\mu$m and a square shaped fine hole 3 having sides of 0.1 $\mu$m. The limited aperture has a radius of 0.5 mm so that the scattered electrons 6 are mostly blocked from being detected by electron detector 4, thereby improving the detection ratio of electrons passing through the hole to scattered electrons.

Figure 6:
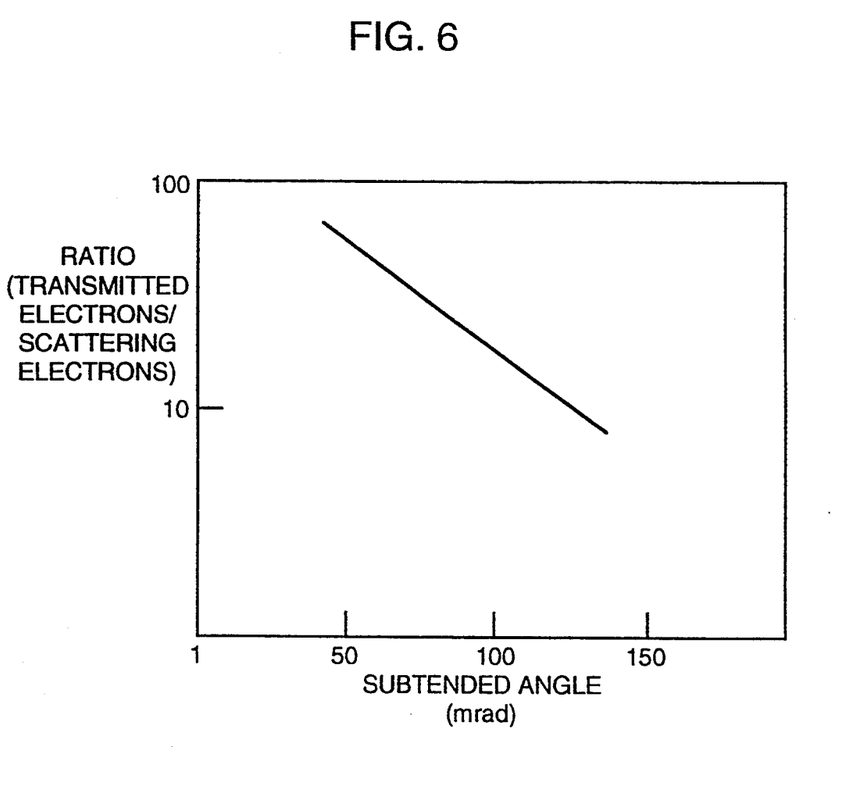
FIG. 6 is a diagram showing the relationship between the ratio of transmitted electrons (passing through the hole) to scattered electrons for a range of subtended angles when a limited aperture is used according to the second embodiment of the invention.

This ratio is related to the radius of the limited aperture 7 in that the subtended angle $\theta$ formed between the fine hole 3 and the perimeter of the aperture changes as the radius of the aperture is increased, as shown in FIG. 6. As shown in the figure, the ratio of detected electrons transmitted through the fine hole to scattered electrons decreases as the subtended angle increases, or as the radius of the limited aperture 7 is increased. The preferred range of limited aperture radius is preferably between 0.5 mm and 2 mm, but the actual subtended angle also depends on the separation distance between the limited aperture 7 and the substrate 2.

In the present example of this embodiment, wherein an aperture having a radius of 0.5 mm is provided, the signals obtained from the detector provide very high contrast, as compared with the signals provided by the arrangement for the first embodiment.

Further, in this second embodiment of the invention, the provision of the fine square hole 3 measuring 0.1 $\mu$m along each side makes it possible to correct a figured electron beam with a resolution of 0.1 $\mu$m. The figured electron beam 1 is scanned as in the first embodiment to obtain the output from the detector representing the figure, and the electron optics are corrected to obtain maximum edge sharpness. In this example of the second embodiment, a line and space pattern of up to 0.5 $\mu$m feature size was obtained using a cell projection method.

In a third embodiment of the present invention, an electron beam is shaped using a cell having a dot pattern as shown in FIG. 8. When the electron beam is shaped using this pattern, it is easy to accurately correct the electron optics in both the X and Y directions simultaneously, thereby particularly correcting the astigmatism of the electron optics. The same scanning direction and stepping direction used in the first and second embodiments of the invention are also used according to the third embodiment.

According to the foregoing embodiments, the process for correction of the optics prior to lithography of a sample includes moving a substrate 2 having a fine hole 3, arranged under the objective lens, within the deflection field of the electron beam by a stage 21. It is assumed that the surface of the substrate 2 is approximately flush with the sample that is to undergo lithography in order to make the focus and astigmatism correction at the appropriate height or correction plane above the stage. Accordingly, for the foregoing embodiments, after correction of the electron optics, the sample having a surface in the plane of correction is moved by the stage into the field of the electron beam and lithography is performed to form the patterns on the surface of the sample.

Figure 10:
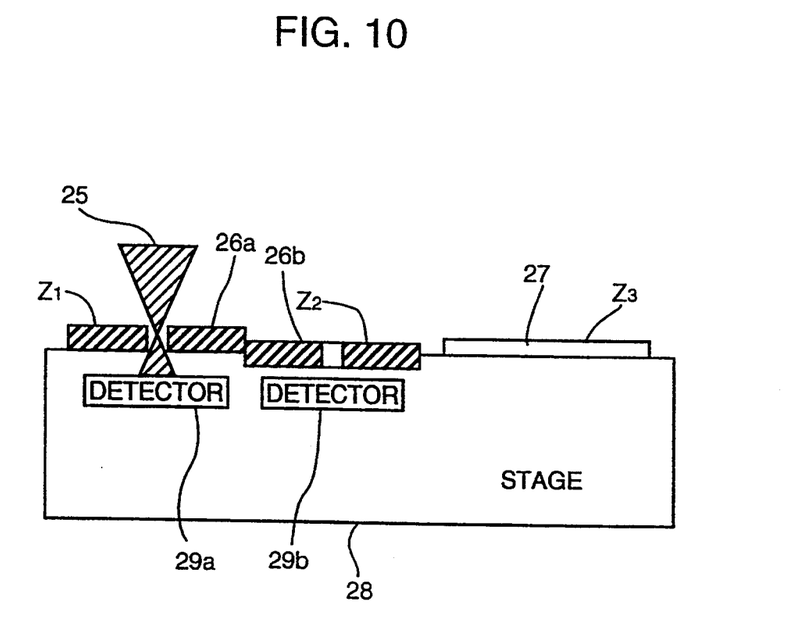
FIG. 10 is a diagram illustrating an alternative embodiment of a stage supporting a substrate having a fine hole through which a figured electron beam is passed, according to the present invention.

According to an alternative embodiment shown in FIG. 10, two substrates 26a and 26b are placed on stage 28, each having different relative heights $Z_1$ and $Z_2$ with respect to the surface of the state. Preferably height $Z_1$ is greater than height $Z_3$ of the surface of the sample 27 and height $Z_2$ is less than height $Z_3$. Thus, the height of the sample surface is between the reference heights $Z_1$ and $Z_2$.

To adjust the optics for an electron beam lithography apparatus using a stage having two substrates with fine holes as shown in FIG. 10, first the fine hole of the substrate 26a having a height $Z_1$ is moved into the deflection field of the electron beam by the stage. Then, the electrons that pass through the fine hole are detected by electron detector 29a. The data of these electrons is stored and the process is repeated for the substrate 26b having a height $Z_2$, which is moved into the deflection field of the electron beam by the stage for detection of the electrons passing through the fine hole by electron detector 29b. Once the data is detected for both of the substrates having different heights $Z_1$ and $Z_2$, respectively, a computer, such as computer 23 shown in FIG. 3, computes optimum correction data corresponding to the heights by a predetermined algorithm.

When a sample 27 having a surface height $Z_3$ is next moved into the deflection field of the electron beam by the stage for lithography, the height $Z_3$ is determined and the optimum correction data is computed by an algorithm, using interpolation for example. Then, correction of the electron optics is performed using the correction data computed to be optimum for sample 27.

According to the arrangement shown in FIG. 10, samples having surfaces at different heights and thus requiring different correction planes for correcting the electron optics that are preferably within a range from $Z_1$ to $Z_2$ (relative to the stage) or just outside this range can be used without requiring an adjustment in the height of the substrates having the fine hole. Therefore, unlike the arrangement for the first and second embodiments, the sample having the fine hole does not need to be substantially flush with sample that is to be subject to lithography.

While preferred embodiments have been set forth with specific details, further embodiments, modifications and variations are contemplated according to the broader aspects of the present invention, all as determined by the spirit and scope of the following claims.

We claim:

1. An electron beam lithography apparatus using a cell projection method for shaping the electron beam into a figured electron beam, comprising:
   electron optics for focusing the electron beam onto a stage, including means for correcting focus and astigmatism of the figured beam;
   said stage supporting a sample to be subjected to lithography and a substrate, wherein the substrate has a hole positioned to be in a scanning path of the figured electron beam during correction of the electron optics;
   an electron detector positioned adjacent said hole to receive electrons from said figured electron beam that pass through said hole and for providing an output representing an intensity of the electrons that are detected;
   means for processing the output signal from the electron detector to provide a correction signal; and
   said correcting means receiving said correction signal and correcting focus and astigmatism of said electron optics on the basis of said correction signal.

2. An electron beam lithography apparatus according to claim 1, wherein said hole of said substrate has a square shape having a dimension along each side that ranges from a size less than a minimum feature size of a lithographic figure used for shaping the figured beam to a size twice as large as the minimum feature size.

3. An electron beam lithography apparatus according to claim 2, wherein said substrate has a thickness through which said hole passes that is less than the electron range for the figured electron beam.

4. An electron beam lithography apparatus according to claim 1, further including a limited aperture disposed between said substrate and said electron detector for preventing detection of scattered electrons that have not passed through said hole.

5. An electron beam lithography apparatus according to claim 1, wherein said figured electron beam is shaped by passing said electron beam through one of a cell having a line and space pattern or a cell having an array of dots regularly arranged in orthogonal directions.

* * * * *